United States Patent
Zhang et al.

(10) Patent No.: US 9,410,981 B2
(45) Date of Patent: Aug. 9, 2016

(54) MEMS SENSOR WITH DYNAMICALLY VARIABLE REFERENCE CAPACITANCE

(71) Applicant: Analog Devices, Inc., Norwood, MA (US)

(72) Inventors: Xin Zhang, Acton, MA (US); Michael W. Judy, Ipswich, MA (US)

(73) Assignee: Analog Devices, Inc., Norwood, MA (US)

( * ) Notice: Subject to any disclaimer, the term of this patent is extended or adjusted under 35 U.S.C. 154(b) by 565 days.

(21) Appl. No.: 13/910,755

(22) Filed: Jun. 5, 2013

(65) Prior Publication Data

US 2015/0355222 A1    Dec. 10, 2015

Related U.S. Application Data

(60) Provisional application No. 61/655,841, filed on Jun. 5, 2012.

(51) Int. Cl.
*G01P 15/125* (2006.01)
*B81B 3/00* (2006.01)
*G01P 15/08* (2006.01)

(52) U.S. Cl.
CPC ............ *G01P 15/125* (2013.01); *B81B 3/0086* (2013.01); *B81B 3/0094* (2013.01); *B81B 2201/0221* (2013.01); *B81B 2201/0235* (2013.01); *B81B 2203/0118* (2013.01); *B81B 2203/0307* (2013.01); *B81B 2203/04* (2013.01); *G01P 2015/0837* (2013.01)

(58) Field of Classification Search
CPC .... G01P 15/125; G01P 15/0802; G01P 15/18
USPC ............ 73/514.32, 514.16, 514.01, 488
See application file for complete search history.

(56) References Cited

U.S. PATENT DOCUMENTS

| | | | |
|---|---|---|---|
| 4,951,236 A | 8/1990 | Kawate et al. | |
| 5,352,918 A | 10/1994 | Thomas et al. | |
| 6,158,280 A | 12/2000 | Nonomura et al. | |
| 6,308,569 B1 | 10/2001 | Stewart | |
| 6,892,576 B2 | 5/2005 | Samuels et al. | |

(Continued)

FOREIGN PATENT DOCUMENTS

| | | | |
|---|---|---|---|
| JP | 05248976 | 9/1993 | ............... G01L 9/12 |
| KR | 10-2009-0117004 | 11/2009 | |

(Continued)

OTHER PUBLICATIONS

Robinson, Mark (Authorized Officer), Notification of Transmittal of the International Search Report and the Written Opinion of the International Searching Authority, or the Declaration; PCT/US2013/044333, 9 pages, Sep. 23, 2013.

*Primary Examiner* — Lisa Caputo
*Assistant Examiner* — Nathaniel T Woodward
(74) *Attorney, Agent, or Firm* — Sunstein Kann Murphy & Timbers LLP

(57) ABSTRACT

An MEMS device has a dynamically variable reference capacitor that provides a reference to a sense capacitance. In some embodiments, a 3-axis accelerometer includes a proof mass suspended above a substrate from an anchor, and a cantilevered Z-axis reference capacitor arm suspended above the substrate from the same anchor. In some embodiments, the proof mass is suspended from a plurality of anchors, and each anchor also supports one or more cantilevered arms, the cantilevered arms forming a dynamically variable reference capacitance.

20 Claims, 10 Drawing Sheets

(56) References Cited

U.S. PATENT DOCUMENTS

| | | |
|---|---|---|
| 7,412,887 B2 | 8/2008 | Memishian ................ 73/514.32 |
| 8,100,012 B2 | 1/2012 | Martin et al. |
| 8,146,425 B2 | 4/2012 | Zhang et al. |
| 2006/0037397 A1* | 2/2006 | Memishian ............. G01P 15/18 73/14.32 |

FOREIGN PATENT DOCUMENTS

| | | | | |
|---|---|---|---|---|
| WO | WO 2006/023476 A1 | 3/2006 | ............ | G01P 15/125 |
| WO | WO 2008/086530 A2 | 7/2008 | | |
| WO | WO 2010/027600 A2 | 3/2010 | ................ | B81B 3/00 |

* cited by examiner

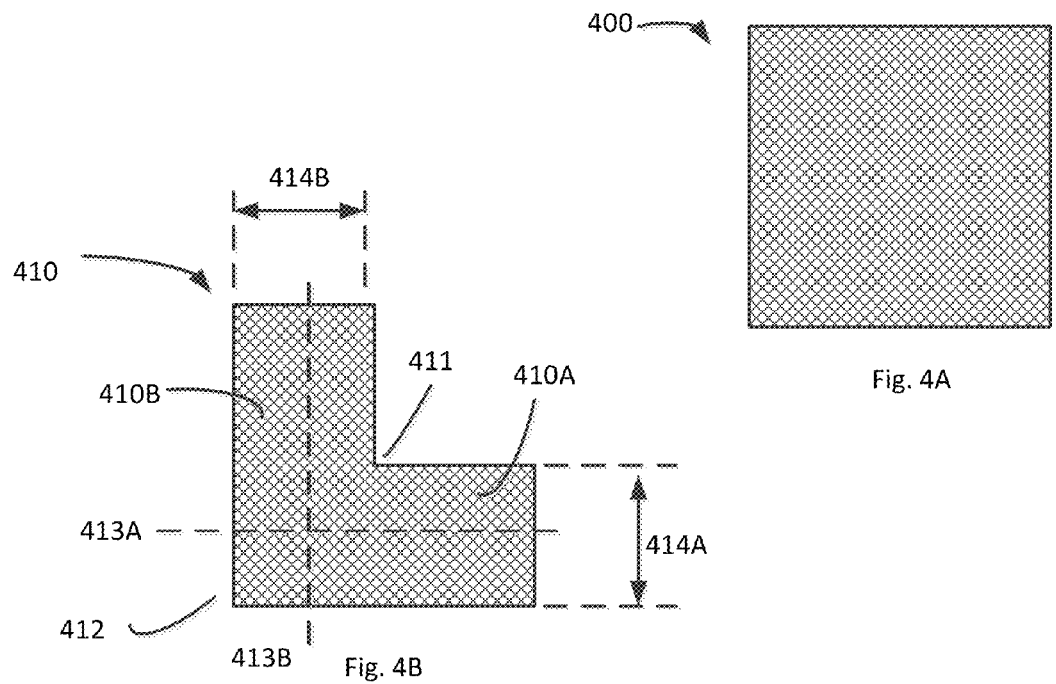
Fig. 4A
Fig. 4B
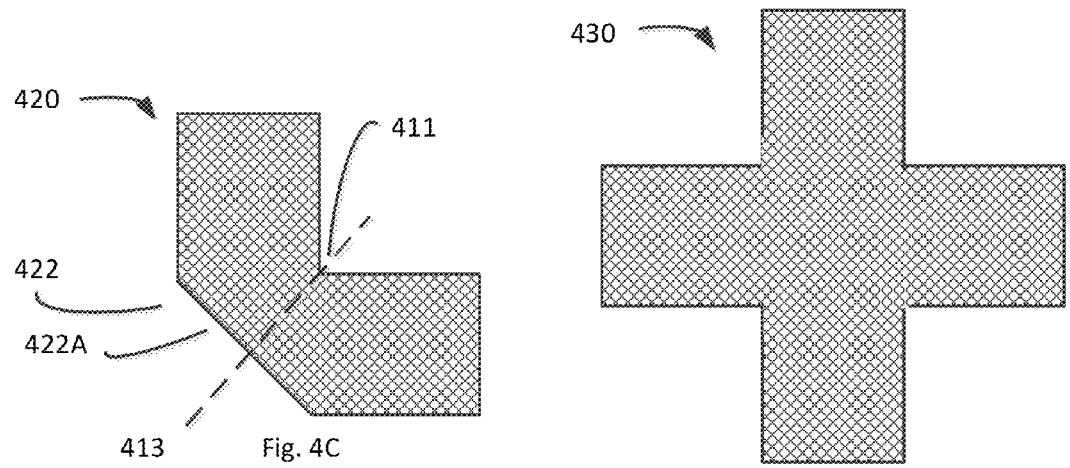
Fig. 4C
Fig. 4D

MEMS SENSOR WITH DYNAMICALLY VARIABLE REFERENCE CAPACITANCE

PRIORITY

The present application claims priority from U.S. provisional application Ser. No. 61/655,841, filed Jun. 5, 2012, titled "3-Axis Accelerometer with Common Anchor for Sensing and Reference Capacitors" and naming Xin Zhang and Michael Judy as inventors. The foregoing application is hereby incorporated herein by reference in its entirety.

TECHNICAL FIELD

The present invention relates to accelerometers, and more particularly to a Z-axis accelerometer.

BACKGROUND ART

Some micromachined ("MEMS") accelerometers detect acceleration by sensing the displacement of a proof mass, or beam. Some accelerometers quantify the displacement of a beam by assessing the change of resistance in a piezo element coupled to the proof mass. Other accelerometers quantify the displacement by assessing a change of capacitance caused by the displacement of the beam, for example if a portion of the beam forms a variable capacitor with a substrate, or with sensing fingers.

Some capacitive accelerometers quantify the displacement of a beam by comparing a capacitance formed by the beam with a reference capacitance. For example, some prior art capacitive accelerometers include a reference capacitor that is separate from the beam, and that is ideally a fixed capacitance.

SUMMARY OF THE EMBODIMENTS

In a first embodiment of the invention there is provided a MEMS device having a substrate having a surface, the surface defining a Z-axis normal to the surface; an anchor extending from the surface in the direction of the Z-axis; a beam suspended from the anchor such that the beam is parallel to the surface, the beam forming a sense capacitance with the substrate; a dynamically variable reference capacitance, the reference capacitance providing a reference for the sense capacitance; and a sensing circuit electrically coupled to the sense capacitance and the dynamically variable reference capacitance, the sensing circuit configured to assess a difference between a charge on the sense capacitance and a charge on the reference capacitance.

In some embodiments, the MEMS device also includes a base, the substrate mounted to the base, and wherein the dynamically variable reference capacitance is matched within 0.02 percent to the sense capacitance.

In some embodiments, the dynamically variable reference capacitance includes a first cantilevered arm suspended from the anchor, the anchor being the same anchor from which the beam is suspended, the first cantilevered arm forming the reference capacitance with the substrate. In other embodiments, the arm further includes an electrode, the electrode forming the reference capacitance with the substrate.

In some embodiments, the beam has an edge length, and the cantilevered arm has a length in a direction extending from the anchor, and the edge length of the beam is substantially greater than the length of the cantilevered arm (e.g., the length of the cantilevered arm is substantially smaller than the length of the beam). In some embodiments, the length of the cantilevered arm is at least 0.20 times the edge length of the beam.

In some embodiments, wherein the anchor defines a cross-section in a plane parallel to the substrate, the cross-section having a first branch and a second branch, the first branch and the second branch meeting at a right angle to form an intersection. In some embodiments, the anchor has a chamfered outside corner at the intersection of the first branch and the second branch.

In some embodiments, the substrate further includes a reference electrode, the reference electrode forming the reference capacitance with the arm.

In some embodiments, the sense capacitance and the dynamically variable reference capacitance are electrically coupled to form a node at the anchor, the node coupled to the sensing circuit.

In some embodiments, the first cantilevered arm includes a T-shaped electrode, while in some embodiments, the first cantilevered arm includes an offset-T electrode.

Some embodiments also include a second cantilevered arm suspended from the anchor parallel to the substrate and extending from the anchor in a direction orthogonal to the first cantilevered arm.

In some embodiments, the beam has a periphery and the anchor is within the periphery of the beam.

In another embodiments, a capacitive accelerometer includes a conductive substrate having a first surface, the first surface defining a plane, the plane defining a Z-axis normal to the plane; a first quadrant structure having (a) a chamfered L-shaped anchor having a first branch and a second branch; (b) a first cantilevered reference electrode rigidly suspended from the first branch; (c) a second cantilevered reference electrode rigidly suspended from the second branch, such that the first cantilevered reference electrode extends from the anchor in a direction orthogonal to the direction of the second cantilevered reference electrode; and also includes a second quadrant structure identical to the first quadrant structure, the second quadrant structure adjacent to the first quadrant structure and rotated in plane by 90 degrees relative to the first quadrant structure; a third quadrant structure identical to the first quadrant structure, the second quadrant structure adjacent to the second quadrant structure and rotated in plane by 90 degrees relative to the second quadrant structure and by 180 degrees relative to the first quadrant structure; a fourth quadrant structure identical to the first quadrant structure, the fourth quadrant structure adjacent to the third quadrant structure and rotated in plane by 270 degrees relative to the first quadrant structure, such that the accelerometer has a plurality of anchors, one anchor in each quadrant, and a corresponding plurality of cantilevered reference electrodes; a beam suspended from the plurality of anchors, the beam having an outer periphery that surrounds the plurality of anchors and the plurality of cantilevered reference electrodes.

In some embodiments, each of the cantilevered reference electrodes includes a T-shaped electrode, while in other embodiments each of the cantilevered reference electrodes includes an offset-T-shaped electrode.

In another embodiment, a method of sensing Z-axis acceleration, the method includes providing a substrate having a surface, the surface defining a Z-axis normal to the surface; providing a sense capacitance, the substrate forming one electrode of the sense capacitance; providing a dynamically variable reference capacitance, the reference capacitance providing a reference for the sense capacitance; and providing a sensing circuit electrically coupled to the sense capacitance and to the reference capacitance, the sensing circuit configured to assess the difference between a charge on the sense capacitance and a charge on the reference capacitance.

Some embodiments also include providing a substrate further including providing an anchor extending from the surface in the direction of the Z-axis; providing sense capacitance including providing a beam suspended from the anchor such that the beam is parallel to the surface, the beam forming a sense capacitance with the substrate; and providing a dynamically variable reference capacitance further including suspending a cantilevered reference electrode from the anchor, the anchor being the same anchor from which the beam is suspended.

Some embodiments include dynamically varying the reference capacitance such that the reference capacitance remains matched to within 0.01 percent of the sense capacitance.

In some embodiments, the sense capacitance has a nominal sense value, and the dynamically variable reference capacitance has a nominal reference value, and the method further includes (a) mounting the substrate to a base; and simultaneously (b) varying the sense capacitance and the reference capacitance such that that the reference capacitance remains matched to within 0.01 percent of the sense capacitance.

BRIEF DESCRIPTION OF THE DRAWINGS

The foregoing features of embodiments will be more readily understood by reference to the following detailed description, taken with reference to the accompanying drawings, in which:

FIGS. 4A-4D schematically illustrate various embodiment of anchors;

DETAILED DESCRIPTION OF SPECIFIC EMBODIMENTS

Figure 1A:
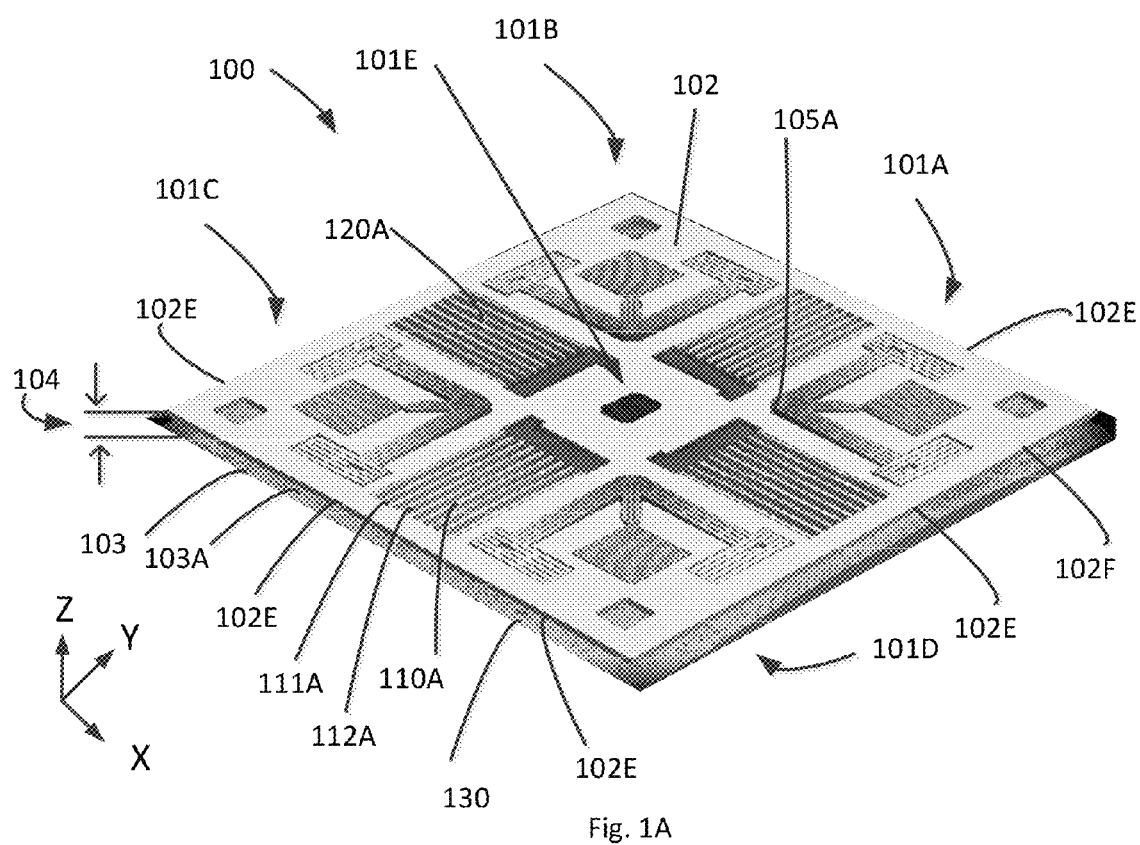
FIGS. 1A-1F schematically illustrate features of various embodiments of an accelerometer.

Various embodiments provide a Z-axis accelerometer with improved accuracy and lower offset as compared to prior art Z-axis accelerometers. The architecture of the accelerometer's suspension system includes a variable Z-axis reference capacitor that dynamically, automatically and contemporaneously adjusts to match non-acceleration-induced deviations in a corresponding Z-axis sensing capacitor. A perspective view of a first embodiment of an accelerometer 100 is schematically illustrated in FIG. 1A. The accelerometer 100 includes four quadrants of structure 101A, 101B, 101C and 101D, arranged symmetrically about a center point 101E. The features of an alternate embodiment of a quadrant, 101F, are described in more detail below. Generally, all four quadrants of accelerometer 100 are identical to each other, except for their orientation relative to the center point 101E.

The accelerometer 100 includes a proof mass (or "beam") 102 suspended above a substrate 103, and separated from the substrate by a gap 104 which may be known as a Z-gap. The proof mass 102 has edge segments 102E that define a periphery 102F of the proof mass. Proof mass 102 may be square, or may be rectangular, for example, or a variety of other shapes.

Figure 1B:
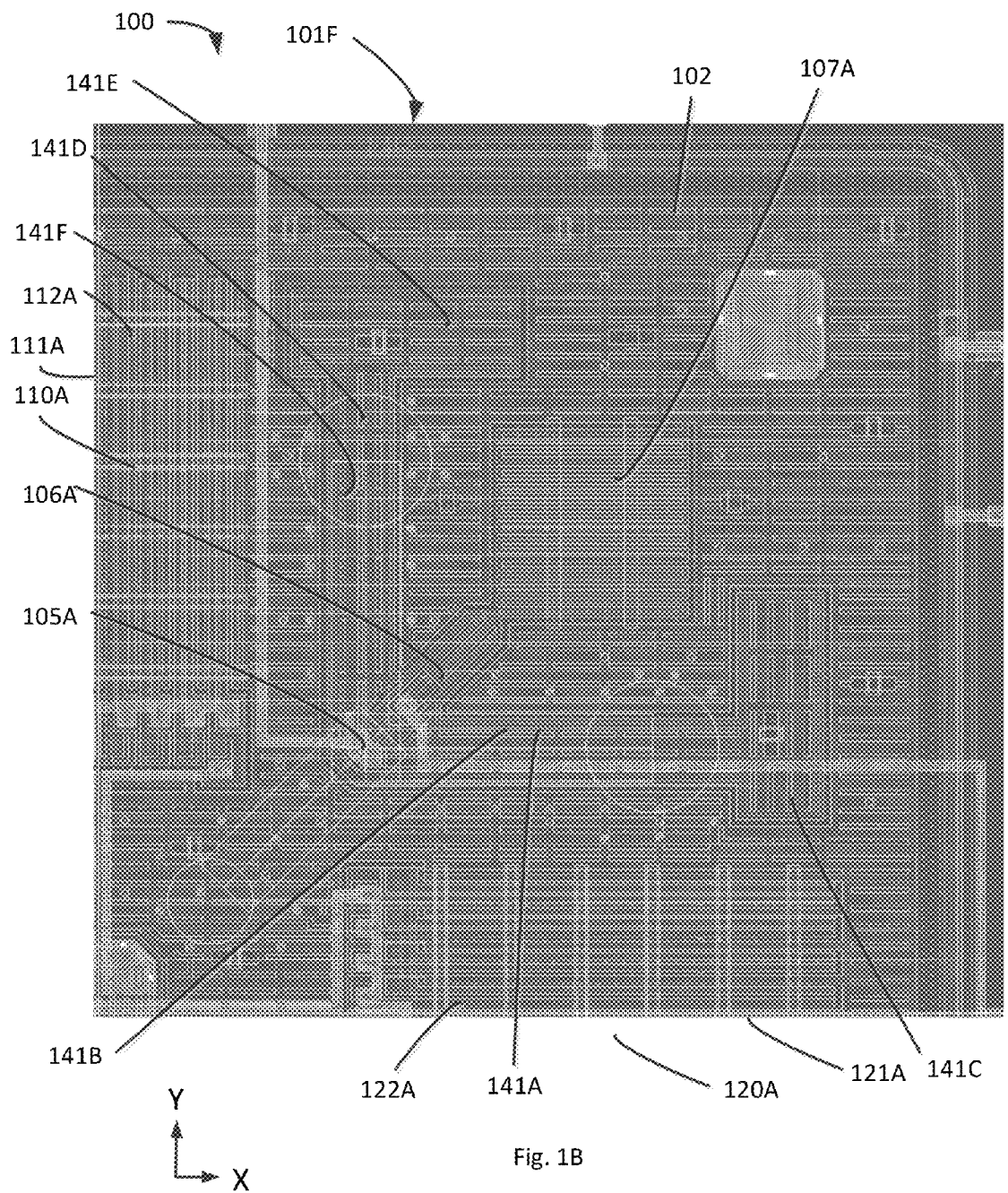

Accelerometer 100 also includes four anchors extending from substrate 103, one anchor in each quadrant 101A, 101B, 101C and 101D. An embodiment of an anchor 105A is schematically illustrated in FIG. 1B, and is visible through proof mass 102 as if proof mass 102 were translucent.

The proof mass 102 is suspended above the substrate from anchor 105A by a beam suspender 106A. A serpentine spring 107A couples the distal end of beam suspender 106A to proof mass 102, such that proof mass 102 is flexibly suspended from the substrate. Specifically, proof mass 102 may move relative to the substrate in the Z-axis, in the X-axis, or in the Y-axis, or in any combination of those axes. The beam suspender 106A has a length in the X-Y plane extending from the anchor 105A to the spring 107A, and a width transverse to the length in the X-Y plane. For reference, the X, Y and Z axes are indicated in FIG. 1A. Movement in the direction of the arrow for a given axis is deemed to be movement in the positive (or "+") direction along that axis.

Proof mass 102 includes one or more sensing fingers that are electrodes which form variable capacitors with opposing electrodes on the substrate. When accelerometer 100 is subjected to acceleration, the proof mass 102 is displaced relative to the substrate 103, and that displacement may be detected and quantified by sensing the change in the capacitance of one or more of the variable capacitors.

For example, if accelerometer 100 is subject to acceleration in the +X direction of the X axis, proof mass 102 will be displaced in the −X direction, and vice versa. A variable capacitor 110A is formed by finger or fingers 111A on proof mass 102, and substrate electrode or electrodes 112A standing on substrate 103. When the proof mass 102 is displaced in the X axis, the distance between the finger 111A and substrate electrodes 112A changes, producing a change in the capacitance of variable capacitor 110A. That capacitance, or change of capacitance, may be sensed and quantified by ways known in the art. A similar capacitor 120A is formed by finger or fingers 121A and substrate electrodes 122A to sense displacement in the Y-axis. Each of the other quadrants of accelerometer 100 has similar variable capacitors. While the fingers 111A and electrodes 112A in quadrant 101F are oriented such that their longest axis runs parallel to the peripheral edge 102E of the proof mass 102, an alternate embodiment 101A is schematically illustrated in FIG. 1, in which the fingers and substrate electrodes are oriented on an axis that is perpendicular to the edge 102E of the proof mass and that runs through the center point 101E.

In some embodiments, the variable capacitors that sense displacement in the X-axis (e.g., capacitor 110A and its counterparts in other quadrants) are electrically coupled together to form an aggregate variable capacitance for sensing displacement in the X-axis, and the variable capacitors that sense displacement in the Y-axis (e.g., capacitor 120A and its counterparts in other quadrants) are electrically coupled together to form an aggregate variable capacitance for sensing displacement in the Y-axis.

Accelerometer 100 also has variable capacitance structures for sensing displacement of the proof mass 102 in the Z-axis. When subjected to acceleration in the Z-axis, the proof mass 102 moves towards the substrate 103 for acceleration in the +Z direction and away from the substrate 103 for acceleration in the −Z direction. In other words, when subjected to acceleration in the Z-axis, the Z-gap 104 changes.

In accelerometer 100, proof mass 102 and a corresponding electrode 103A on substrate 103 form a capacitance 130 across Z-gap 104. Because Z-gap 104 changes when accelerometer 100 is subject to acceleration in the Z-axis, capacitance 130 is a variable capacitance and maybe known as the Z-axis capacitance or the Z sense capacitance ("Czs"). Specifically, Z sense capacitance 130 varies with the applied acceleration.

Accelerometer 100 also includes a reference capacitance 140, which may be known as the Z-axis reference capacitance, or Z-axis reference capacitor, ("Czr") or simply reference capacitance 140. The Z-axis reference capacitance 140 is formed between a Z-axis reference capacitor electrode 141A and a corresponding electrode 103B on substrate 103.

In some embodiments, the proof mass 102 and the Z-axis reference capacitor electrode 141A are mechanically or electrically connected together to form a common node, and yet form different capacitors because they are suspended opposite different electrodes, 103A and 103B, on the substrate 103. In other embodiments, the substrate may be a single electrical node, and the reference electrode (e.g., 141A) and the proof mass 102 may each have electrically separate electrodes, so as to form individual, electrically separate capacitors with the substrate. Either way, proof mass 102 and Z-axis reference capacitor electrode 141A each may be said to form a capacitance with the substrate.

When accelerometer 100 is not under acceleration, and not under stress such as packaging stress, the Z-axis sense capacitance 130 has a nominal value (Czsn), and the Z-axis reference capacitance 140 also has a nominal value (Czrn). As such, a ratio of Z-axis sense capacitance 130 to the Z-axis reference capacitance 140 has a nominal value. For example, if the nominal value of the Z-axis sense capacitance is equal to the nominal value of the Z-axis reference capacitance, then the nominal ratio (Czsn/Czrn) is one. Alternately, if the nominal value of the Z-axis sense capacitance is seven times the nominal value of the Z-axis reference capacitance, then the nominal ratio is seven, and so forth.

In operation, Z-axis acceleration may be detected by sensing the change in capacitance of Z sense capacitance 130. For example, in some embodiments, a change in the Z sense capacitance of 0.4 percent indicates an acceleration of 1 G in the Z-axis. That change is quantified by sensing the difference between, or change in the relative capacitances of, Z sense capacitance 130 and reference capacitance 140, by circuits and processes known in the art.

For example, in some embodiments, a first clock charges the Z-sense capacitance 130, and a second clock charges the reference capacitance 140. The first clock places charge on the Z-sense capacitance 130, the charge being proportional to the Z-sense capacitance 130 and voltage amplitude (V1) of the first clock (i.e., q=CzsV1), and the second clock places a charge on the reference capacitance 140, that charge being proportional to the reference capacitance 140 and the voltage amplitude (V2) of the second clock (i.e., q=CzrV2). The first clock and second clock are 180 degrees out of phase, so the charges on the Z-sense capacitance 130 and the reference capacitance 140 are of opposite polarity. For example, if the Z-sense capacitance 130 is equal to the reference capacitance 140, and if the amplitude of the first clock is the same as the amplitude of the second clock, the amount of charge on the two capacitances will be equal, but of opposite polarity.

To assess a change in the Z-sense capacitance 130, the charge on the Z-sense capacitance 130 may be compared to the charge on the reference capacitance 140. In some embodiments, the charge on the Z-sense capacitance 130 and the charge on the reference capacitance 140 are initially equal in magnitude but opposite in polarity so that they cancel and produce zero initial offset.

In accelerometer 100, when not under acceleration, the Z sense capacitance 130 is larger than the reference capacitance 140 by a ratio of 7:1. The amplitudes of the first and second clocks have the inverse ratio, with the result that, when the accelerometer is not under acceleration, each capacitor receives the same amount of charge.

In contrast, when the accelerometer 100 is experiencing Z-axis acceleration, the Z-sense capacitance 130 will have changed, and the charge on that capacitance will be different from the charge under non-acceleration. The difference between the charge on the Z-sense capacitance 130 and the reference capacitance is proportional to the displacement of the proof mass 102, and therefore indicative of the quantity and direction of the acceleration.

As can be understood from the example above, even a small deviation in either or both of the capacitances, if the deviation is not due to acceleration, may compromise the accuracy of the measurement. For example, a deviation in reference capacitance 140 due to die stress may produce an offset in the measured charge, which will be interpreted by the accelerometer as evidence of acceleration. For this reason, the structure of the Z reference capacitance is configured so as to allow the Z reference capacitance (Czr) to change in concert with the Z sense capacitance (Czs) in response to various stresses, but to remain substantially constant in response to Z-axis acceleration. Indeed, in some embodiments the Z reference capacitance is dynamically variable, in that the Z reference capacitance varies continuously and automatically. Such a capacitance is distinguishable from prior art reference capacitors that may be trimmed at the time of fabrication, for example.

Figure 1C:
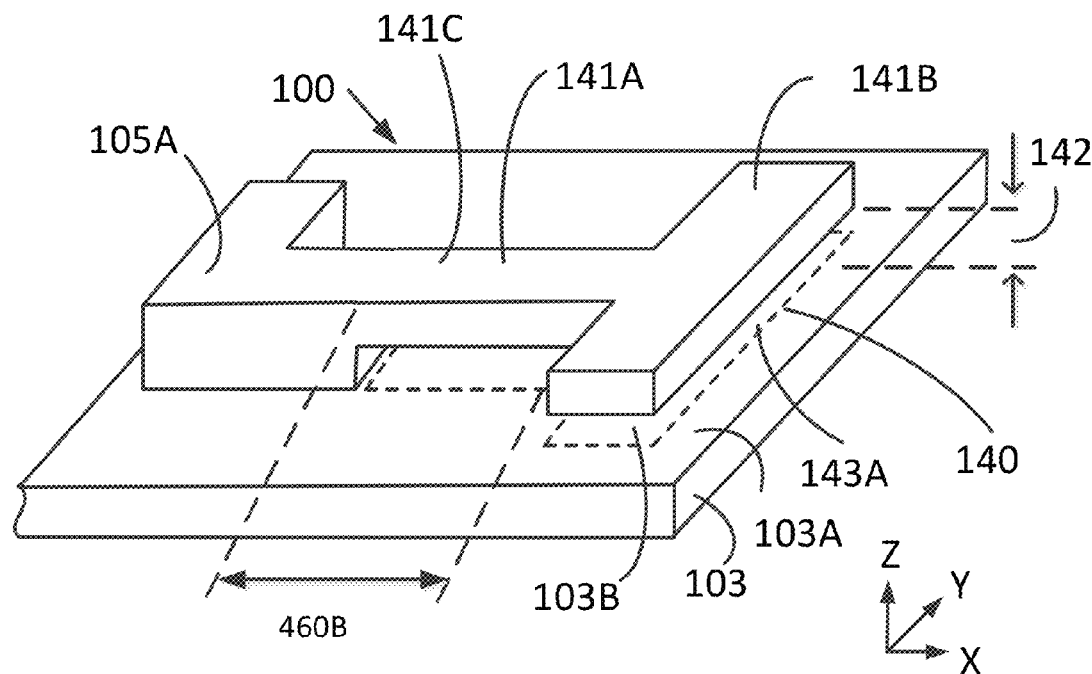

To this end, in the embodiment of quadrant 101F of accelerometer 100 in FIGS. 1B and 1C, the Z-axis reference capacitor electrode 141A includes plate 141B and a cantilevered arm 141C coupled to the anchor 105A. Specifically, the reference capacitor plate 141B and the cantilevered arm 141C are suspended above the electrode 103B, and separated from the substrate by a reference gap 142 between the surface 103A of substrate 103 and the facing surface 143A of electrode 141B. In some embodiments, the dimension of the reference gap 142 in the Z-axis may be identical to the Z-gap. Reference capacitor electrode 141A is not suspended from proof mass 102, and does not move in an X-Y plane above the substrate 103 in response to X axis or Y axis acceleration, and proof mass 102 does in some embodiments.

Quadrant 101F also includes a second reference capacitor electrode suspended from the same anchor 105A, parallel to the substrate and in a direction orthogonal to the direction of electrode 141A, by arm 141F, although plate 141E and arm 141F are omitted from FIG. 1C to avoid cluttering the figure. In some embodiments, electrode 141B and arm 141C are electrically coupled to electrode 141E and arm 141F such that electrode 141B, arm 141C, electrode 141E and arm 141F all contribute to capacitance 140.

Each of the other quadrants 101B, 101C and 101D has Z-axis reference capacitance structure similar to the capacitance structure described for quadrant 101F, and in some embodiments all of the Z-axis reference capacitances are electrically coupled together to form or contribute to aggregate variable reference capacitance 140. In some embodiments, the anchors 105A and reference capacitance electrodes 141A are positioned within the periphery 102F of the proof mass 102. Indeed, in some embodiments, the four quadrant structures (e.g., 101A, 101B, 101C and 101D) are arranged around center point 101E, each rotated 90 degrees from its neighbor, as illustrated in FIG. 1A, for example. In some embodiments, the reference capacitance electrodes (such as electrode 141A, for example) extend away from their respective anchors in the direction of an edge, which may be the nearest edge, 102E of proof mass 102.

Cantilevered arms 141C and 141F and their counterparts in the other quadrants are rigid, and are effectively unbendable in response to acceleration in the Z-axis. As such, reference capacitance 140 changes several orders of magnitude less than Z sense capacitance 130 in response to a given Z-axis acceleration.

When under stress, such as compressive die stress, or bowing, for example, the Z-gap may change. Such stress may arise, for example, as an artifact of the fabrication of the accelerometer 100, or as a result of thermal stress on the accelerometer, to name but a few examples. Alternately, or in addition to, stress in the substrate may arise when the substrate is packaged in ways known in the art.

As such, the Z-axis sense capacitance may change, so that it no longer has its nominal value even when not under acceleration.

Figure 2A:
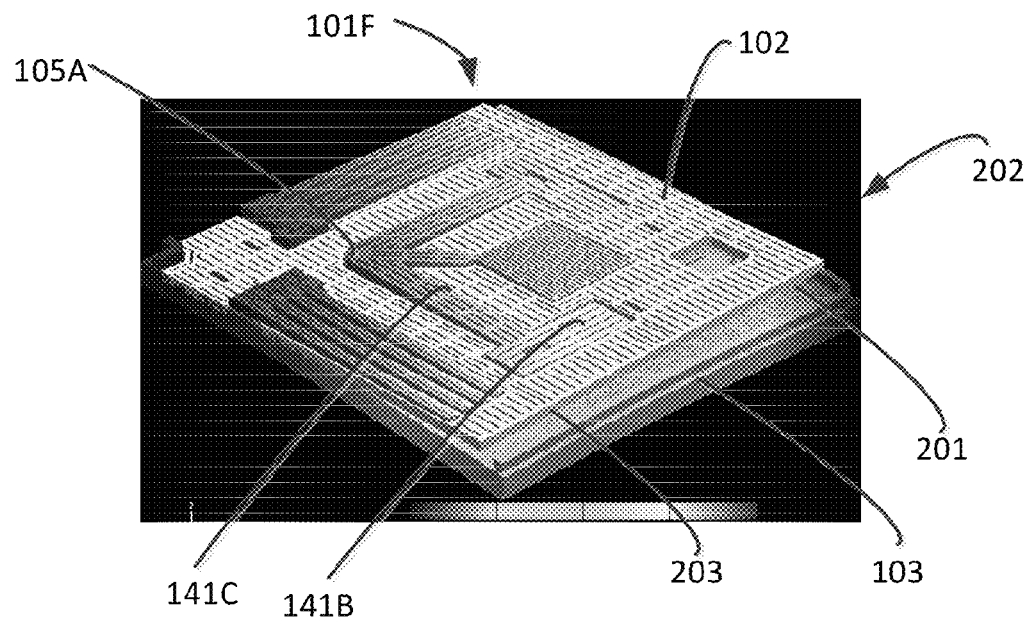
FIGS. 2A-2B schematically illustrate an embodiment of an accelerometer under various stress conditions.
Figure 2B:
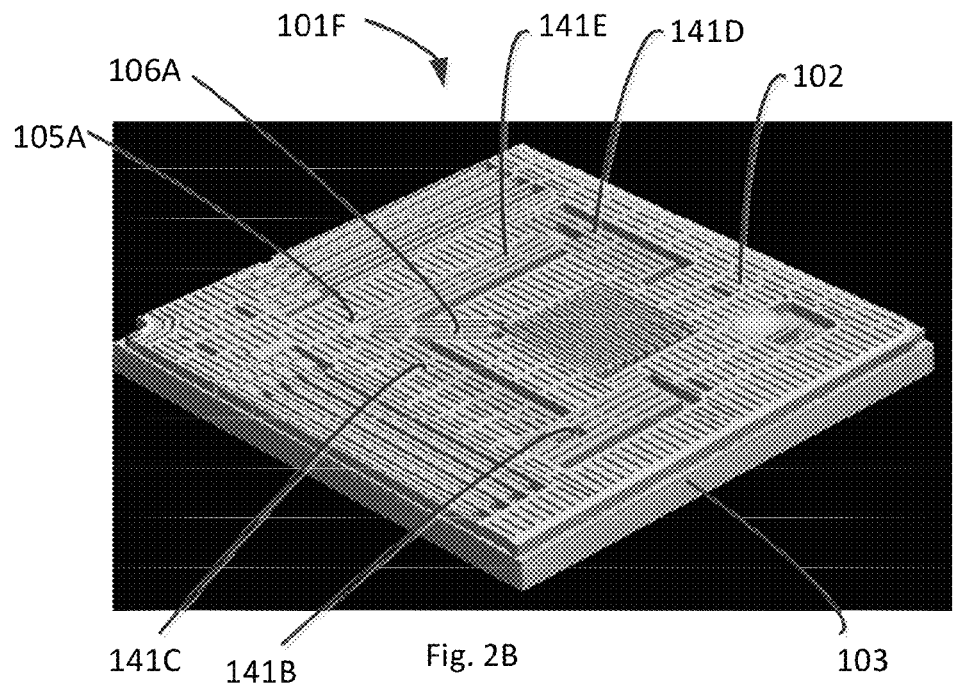

For example, FIG. 2A schematically illustrates quadrant 101F of accelerometer 100, and its spring support 106A and spring movement 107A, under a bowing stress, and FIG. 2B schematically illustrates quadrant 101F under compressive stress. When not subjected to such stress, the proof mass 102 is parallel to the substrate 103, and the Z-gap is nominally identical at all points between proof mass 102 and substrate 103. When subjected to substrate stress or bowing, however, the Z-gap is not consistent, and may deviate from the nominal condition. In fact, the Z-gap may vary considerably from point to point between proof mass 102 and substrate 103. For example, the gap 201 at the corner 202 of quadrant 101 between proof mass 102 and substrate 103 is considerably larger than the gap at other points, such as point 203 for example. In some embodiments, die stress may tend to be lower near the center of the substrate, and more pronounced near the edges of the substrate, or in the region of the substrate near of the edge 102E of the proof mass.

Figure 3:
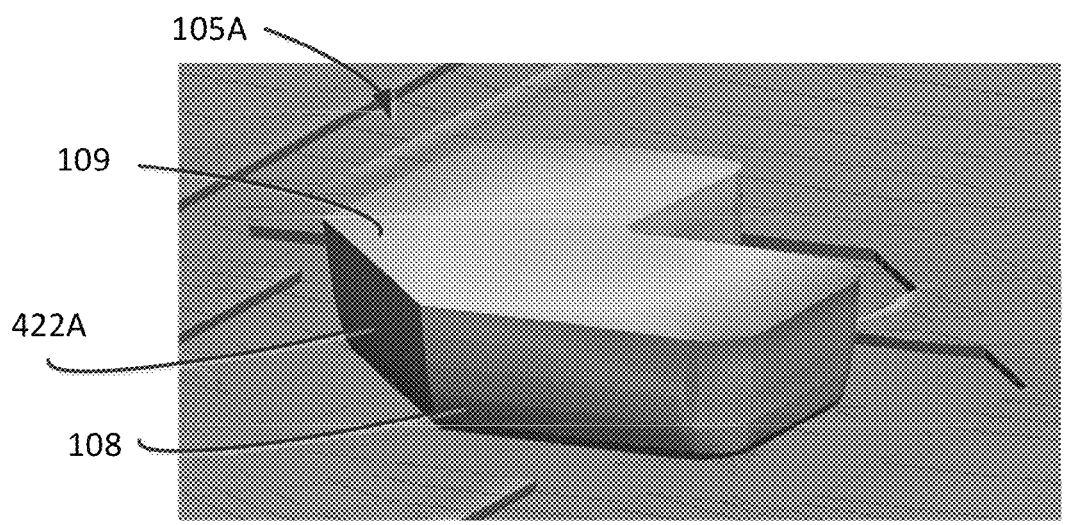
FIG. 3 schematically illustrates an embodiment of an anchor.

A variation in Z-gap may also be caused in whole or in part by a droop or sag in the proof mass 102. For example, stress in the substrate 103 may deform the anchor 105A, as schematically illustrated in FIG. 3. The base portion 108 of anchor 105A may not change to a significant degree, for example if its deformation is limited by the fact that it is integral to the substrate. However, the top portion 109 of anchor 105A is less constrained, and the deformation at the bottom of the anchor is amplified at the top of the anchor, such that the top of the anchor may experience greater deformation. For example, the top portion 109 of anchor 105A may bulge upward in the +Z direction. Because the proof mass 102 is suspended from anchor 105A, such a bulge in the top portion 109 may cause suspender 106A (and reference capacitor beam 141E, as discussed below) to lean or move down towards substrate 102. More specifically, the end of suspender 106A that is further from anchor 105A may move closer to the substrate than the end of suspender 106A that is integral with anchor 105A. Accordingly, the entire proof mass 102 may move towards substrate 103, thereby reducing the Z-gap 104. As such, the nominal Z sense capacitance 130, that is, the capacitance 130 when not subject to acceleration, changes under stress.

If the Z-axis reference capacitance 140 remains fixed, e.g., at its nominal value in such circumstances, then the ratio of the Z-axis sense capacitance to the Z-axis reference capacitance also changes, and the accuracy of the accelerometer in the Z-axis may be compromised, for example by an offset. As such, a reference capacitance that remains substantially unchanged under such circumstances may not be ideal.

However, in accelerometer 100, the Z-axis reference capacitance 140 reacts to the same stress that affects the Z-axis sense capacitance 130, because Z-axis reference capacitance 140 shares an anchor with Z-axis sense capacitance 130. Indeed, the Z-axis reference capacitance 140 changes in such a way as to counteract, or cancel, the changes in the Z-axis sense capacitance. In other words, the ratio of the Z-axis sense capacitance to the Z-axis reference capacitance remains substantially the same. In some embodiments, the ratio may change less than 0.01 percent, or even less, with respect to its nominal value, for example.

Figure 1D:
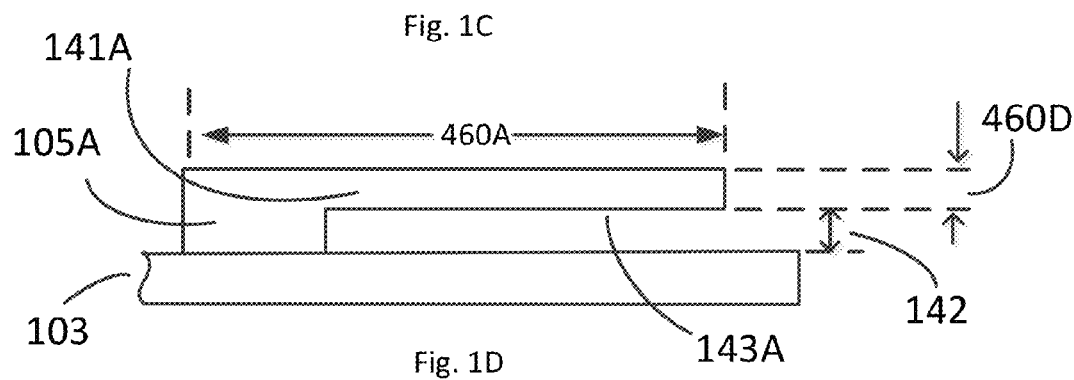
Figure 1E:
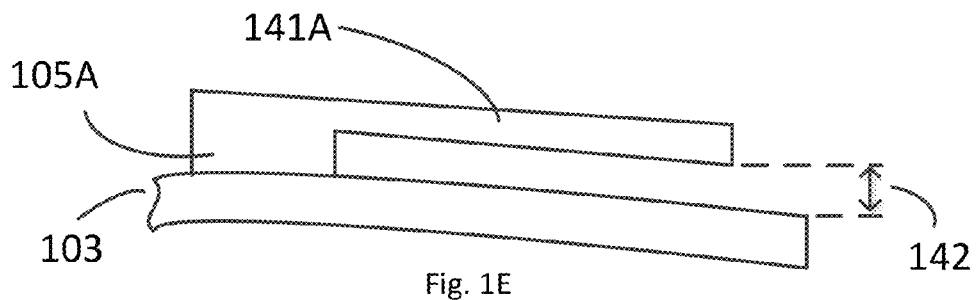

More specifically, electrode 141A may dip down towards substrate 102. For example, FIG. 1D schematically illustrates electrode 141A in nominal position, not under stress, and having a reference gap 142. FIG. 1E schematically illustrates electrode 141A when substrate 103 is warped, and electrode 141A has moved towards substrate 103, such that the reference gap 142 changes only slightly, if at all as between the stressed and un-stressed conditions. As such, the capacitance formed by the electrode 141A and substrate 103 changes, if at all, in a way that corresponds to the change in capacitance between the sense electrode 102 and the substrate 103.

The movement of electrode 141A in this embodiment results from the warpage of the top 109 of anchor 105A, and not due to bending of arm 141C, which remains substantially rigid. In short, the electrode 141A and the proof mass 102 respond in a correlated manner because they are both cantilevered from the same anchor. Such adaptation of the reference capacitance occurs automatically and contemporaneously in response to the same forces that cause a distortion in a corresponding sense capacitance, without the intervention of or input from an operator.

Figure 5A:
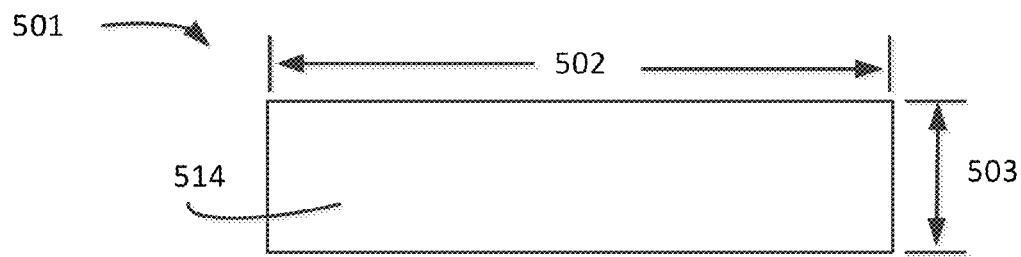
FIGS. 5A-5C schematically illustrate embodiments of reference capacitor electrode structures.

The amount by which electrode 141A moves may depend on a number of factors, including the length 460B and/or width 460C and/or thickness 460D of arm 141C, or alternately the overall length 460A of electrode 141A, or alternately, the length 502 and/or width 503 and/or thickness of electrode 501 in FIG. 5A. For example, the greater the length 460B, the more the electrode 141B at the distal end of arm 141C will move in the Z-axis. If the length 460B is too short, the amount by which arm 141C moves will be insufficient to correlate to the change in the Z-gap, and if the length 460B is too long, the amount by which arm 141C moves will be exceed the amount that correlates to the change in the Z-gap. The width 460C and/or the thickness 460D of the arm 141A may influence the rigidity of the arm 141A, and therefore influence the accuracy of the variable reference capacitance. The designer of the arm 141C and electrode 141B can select the length 460B and width 460C and thickness 460D of arm 141B to compensate for the change in the Z-gap anticipated for the known characteristics of the proof mass.

Figure 1F:
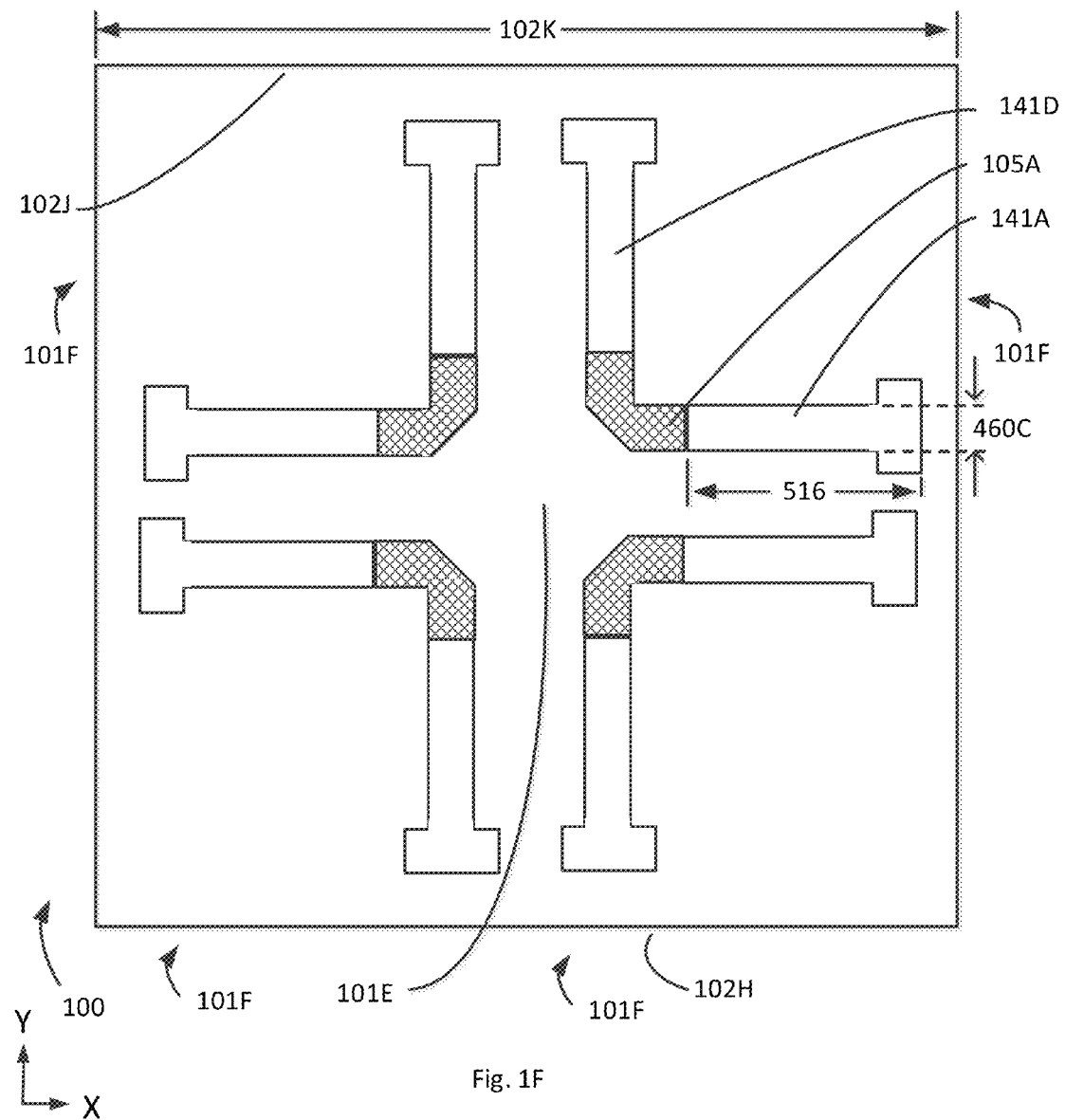

In various embodiments, the length of the electrode 141A may be a substantial fraction of a dimension of the proof mass, such as the length of the nearest edge segment 102E to which the electrode 141A is parallel. In the embodiment of accelerometer 100 as schematically illustrated in FIG. 1F, for example, each of the four quadrants 101F is identical, except that each is rotated 90 degrees with respect to its neighbors around center point 101E. In FIG. 1F, proof mass 102, as well as beam suspenders 106A and springs 107A, are omitted so as to reveal anchors 105A. However, a schematic outline 102H of proof mass 102 is included for reference. Outline 102H schematically illustrates an edge 102J of proof mass 102, and the length 102K of that edge. Outline 102H also schematically illustrates that the anchors (105A) are within the periphery 102H of the proof mass 102. Indeed, in the embodiment of FIG. 1F, the anchors 105A are neither near the center 102E of the proof mass 102, nor near the edge 102J of the proof mass 102, but are displaced from the center 102E by approximately one fourth of the length 102K. In some embodiments, the anchors 105A may be nearer to the center 102E, although die stress may be minimal near the center 102E with the result that the deformation of the anchors 105A may be minimal, such that the resulting displacement of the proof mass 102 and the electrodes 141A may not sufficiently respond to warpage of the substrate 103. In some embodiments, the anchors 105A may be further from the center 102E. In the embodiment of FIG. 1F, the electrodes 141A extend in a direction generally away from the center 102E (e.g., away from the center of the proof mass 102), and in some embodiment one or more electrodes 141A may extend radially away from the center 102E.

Each of the reference electrodes (e.g., 141A) in FIG. 1F has a length 516 that is a substantial portion of the length of the edge segment to which it is parallel, such that there is a relationship between the length of the cantilevered reference electrode and the dimensions of the proof mass for which the cantilevered electrode provides a reference capacitance. A long cantilever may be desirable so that the change in reference capacitance 130 due to stress or warpage is correlated to the change in Z sense capacitance due to the same stress or warpage. For example, electrode 141A is parallel to edge segment 102J that has a length 102K. Electrode 141A has a length 516 that is at least 0.20 times the length of that edge (e.g., 516=0.2 102K). Some embodiments have electrodes of different lengths. For example, in some embodiments, the electrode may be 0.25 or 0.3, or 0.5 times the length of the edge 102J, to provide but a few examples. In some embodiments, the length 516 of the electrode 141A may be assessed relative to the length of the beam suspender 106A. For example, the length 516 of the electrode 141A may be equal to or longer than the length of beam suspender 106A. Indeed, in some embodiments the length 516 of the electrode 141A may be 1.1 times, 1.2 times, or 1.5 times the length of beam suspender 106A.

As such, in various embodiments the reference capacitance 140 changes in concert with the Z sense capacitance 130 in response to stress, but not in response to Z-axis acceleration. In this way, the effect of such stresses and distortions on the Z sense capacitance 130 may be mitigated or even cancelled by corresponding changes to reference capacitance 140.

Even if the changes in reference capacitance 140 and Z sense capacitance 130 do not precisely cancel one another, the mutual changes in capacitance yield an improvement over prior art three-axis accelerometers. For example, some prior art accelerometers included one or more reference capacitances at or near the outer periphery of a proof mass. The electrodes or plates of such reference capacitances did not share a common anchor with the proof mass, and as such the change in reference capacitance due to bowing or substrate deformation under other stress was not correlated to a change in the capacitance between the proof mass and substrate, leading to offset errors or other inaccuracies and degradation in accelerometer performance. As such, the architecture of accelerometer 100, including the suspension of the proof mass 102 and reference capacitance from a common anchor 105A (or a set of common anchors in the various quadrants) leads to significantly improved performance.

For example the quadrant 101F of FIG. 2A may represent an accelerometer 100 under a −0.36 um bow, where bow is measured as die deformation difference from die center to corner. Such a bow would cause a significant change in a prior art z-axis reference capacitor, as well as a change in the capacitance between the proof mass and substrate, as the bowing increased the gap between them. However, in the embodiment of FIG. 2A, the reference capacitor structures 141B, 141C, 141E and 141F react in a manner similar to the warpage of the proof mass, with the result the that a change in the Z sense capacitance 130 is closely matched by a change in the reference capacitance 140. In some embodiments, the Z sense capacitance 130 has been observed to change by 1.23 percent under such bowing, while the reference capacitance 140 experiences a change of 1.21 percent. These capacitance changes are closely matched; they differ by less than 0.01 percent.

As such, various embodiments represent a significant improvement over prior art accelerometers, in which the capacitances were significantly less well matched. For example, some prior art accelerometers produced differences of 25 percent between their Z sense capacitance and their reference capacitance (i.e., only a 75 percent match or correlation). As a result, various embodiments exhibit far less sensitivity to stress, and have less offset and drift, than prior art accelerometers.

Embodiments of anchor 105A may take a variety of shapes. For example, one embodiment 400 is schematically illustrated in FIG. 4A. Anchor 400 has a rectangular or square cross section in a plane just above the substrate, but below the points from which reference capacitors and a proof mass may be suspended.

An alternate embodiment 410 is schematically illustrated in FIG. 4B, and may be referred to as an "L-shaped" (or "gamma shaped"). Anchor 410 has two branches 410A and 410B that intersect at right angles, thereby forming an inside corner 411 and an outside corner 412, in a plant just above the substrate. Each branch has a long axis, 413A and 413B, respectively, along its length (e.g., its longest dimension parallel to a substrate that supports the anchor), and a width 414A and 414B, respectively. In anchor 410, the axes 413A and 413B intersect at a right angle in a plane parallel to the substrate. In an alternate embodiment, the anchor 430 may have a cross, or plus, shape (i.e., +), as schematically illustrated in FIG. 4D. In some embodiments, anchor 430 may be described as including two of anchor 410, or two of anchor 420, as described herein. Reference electrodes, such as any of those schematically illustrated herein, and sense electrodes may be suspended from any point or edge on the anchor 430.

An alternate embodiment 420 is schematically illustrated in FIG. 4C, and is similar to L-shaped anchor 410, except that outside corner 422 is chamfered. Specifically, the shape of anchor 420 may be referred to as a "chamfered-L" shape, because it has two branches that intersect at a right angle and thereby form an inside corner and an outside corner similar to an L-shaped anchor, except that the outside corner is chamfered. The inventors have discovered that a chamfered-L anchor is more responsive to various stresses than a non-chamfered-L anchor, in some embodiments. In anchor 410 the surface 422A of the outside corner 422 defines a vector 413 normal to that surface 422A, which vector intersects the longest axis of each of the two branches at 45 degree angle in a plane parallel to a substrate that supports the anchor, and which intersects inside corner 411. As such, the length of the face of the chamfered corner 422 is the square root of the sum of the squares of the widths 414A and 414B. However, various embodiments may have chamfered corners similar to chamfered corner 422, except that their respective surface may be larger than surface 422A, or smaller than surface 422A. In some embodiments, vector 414 may not pass through inside corner 411, so that the chamfered corner 422 is not symmetrically oriented with respect to the axes 413A, 413B.

A variety of embodiments of reference capacitor electrodes are schematically illustrated in FIGS. 5A-5D. A plan view of simple embodiment of a reference capacitor electrode 501 is schematically illustrated in FIG. 5A, and has a rectangular shape with length 502 and width 503, as well as a thickness in the dimension normal to the page. In some embodiments, the length 502 may be at least 3 or 4 times the width 503. The capacitance is a function, in part, of the surface area 504 of electrode 501.

Figure 5B:
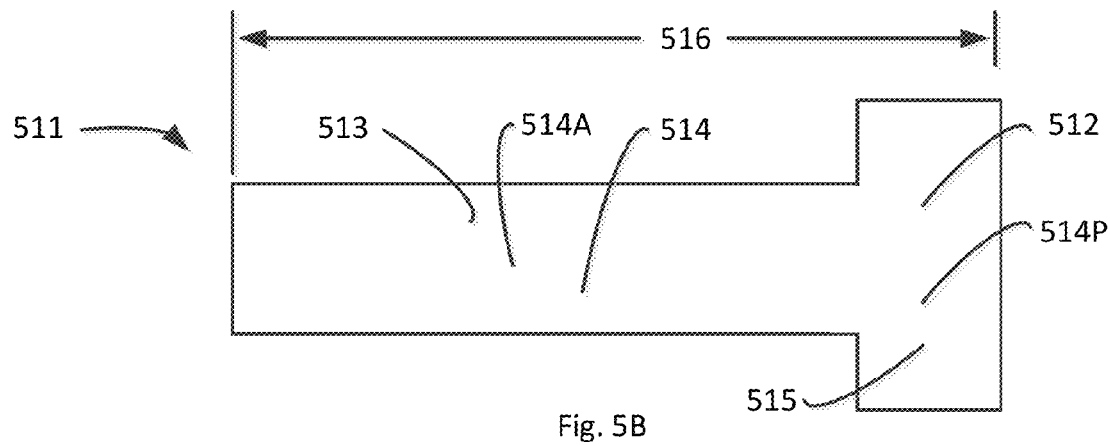

A plan view of an alternate embodiment of a reference capacitor electrode 511 is schematically illustrated in FIG. 5B, and may be known as a "T-shaped" electrode. Electrode 511 includes and arm 513 and a plate 512, similar to electrode 141A, and a length 516 that includes the arm 513 and plate 512. The plate 512 may be considered to be a part of the arm 513. Electrode 511 forms a capacitance with a substrate 103, which is not shown in FIG. 5B but which is represented by substrate 103 in FIG. 1C, for example. The capacitance may be a function, in part, of the surface area 514 of electrode 511, which include the surface area of the arm 514A and the surface area of the plate 514P. A portion of that surface area 514 is formed by the surface area 515 of plate 512. In practice, plate 512 is at the distal end of arm 513, as viewed from the anchor that supports electrode 511 from the substrate 103, and as such may experience the greatest displacement, relative to the substrate, when the anchor warps, as described above. In contrast, the portion of the arm 513 nearest the anchor may experience less displacement, relative to the substrate, for example if its motion is restrained by the dimensions of the anchor. As such, when electrode 511 is displaced, for example due to deformation of the anchor, plate 512 may contribute more to a change of the reference capacitance because of its distance from the anchor.

Figure 5C:
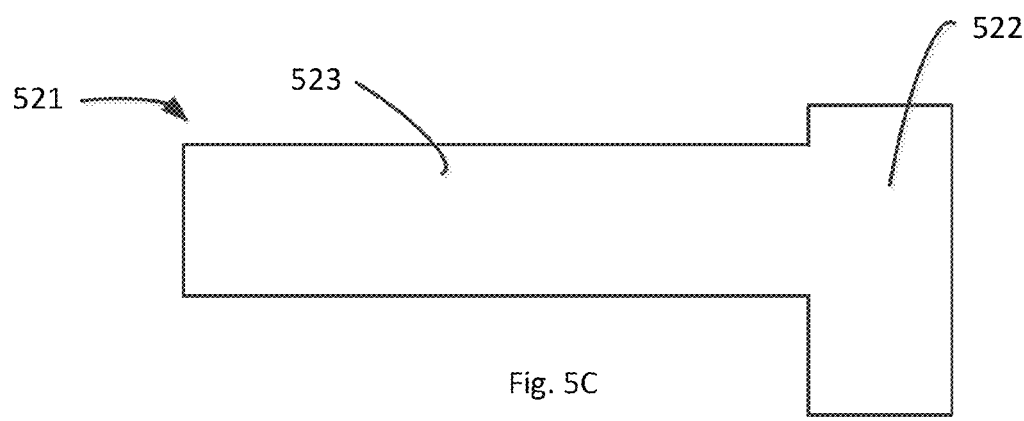

An alternate embodiment of a reference capacitor electrode 521 is schematically illustrated in FIG. 5C, and may be known at an "offset T" shaped electrode because its plate 522 is offset from the center of the long axis of arm 523. Indeed, this is similar in shape to electrode 141A, for example. An offset-T shaped electrode may be considered to be a type of T-shaped electrode.

In some embodiments, the length of a reference capacitor electrode (e.g., 502, 516) may be expressed in terms of the length of a beam suspender (e.g. 106A) supporting the proof mass from the same anchor. For example, in some embodiments the length of a reference capacitor electrode may be equal to or greater than the length of a corresponding beam suspender. More specifically, the length of a reference capacitor electrode may be 1.2, 1.5 or 2 times the length of the corresponding beam suspender.

Figure 6:
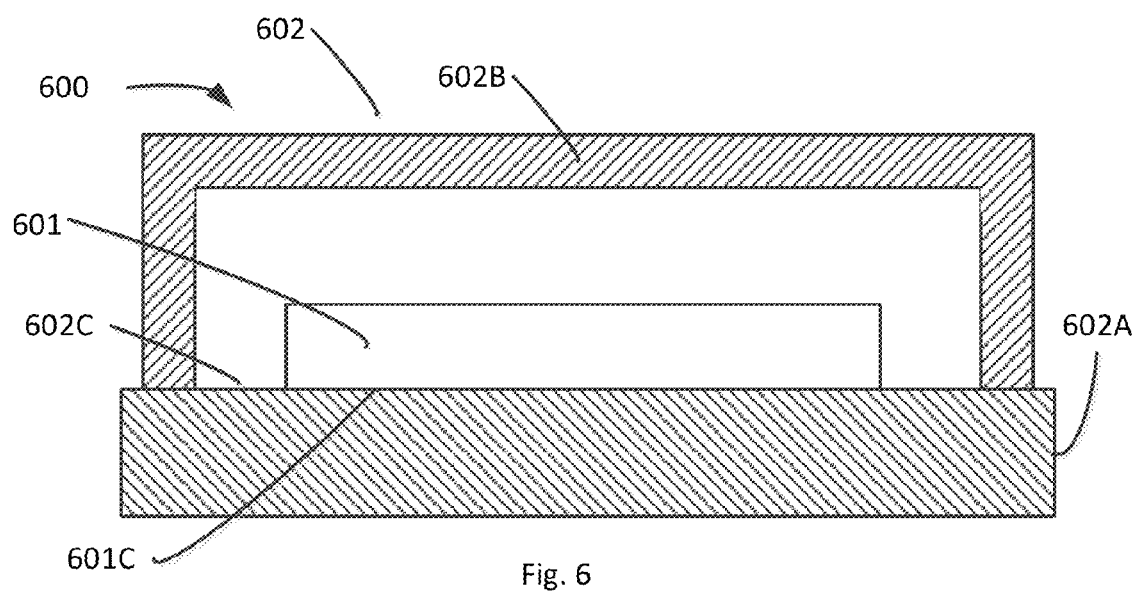
FIG. 6 schematically illustrates a packaged MEMS device.

In some embodiments, a MEMS device may be enclosed in a package. Indeed, the act of enclosing a MEMS device in a package, or the package itself, may induce stress in the MEMS device. For example, a packaged MEMS device 600 is schematically illustrated in FIG. 6, and includes MEMS device 601. MEMS device 601 may be an accelerometer according to any of the embodiments described herein, for example. The package 602 includes a base 602A and a cap 602B.

Fabricating the packaged MEMS device 600 may include fabricating the MEMS device 601, and then placing the MEMS device 601 onto a base 602A, or into the package 602. For example, placing the MEMS device 601 into the package 602 may include securing the MEMS device 601 to the base 602A, and then optionally covering the MEMS device 601 by securing the cap 602B to the base 602A. In some embodiments, the cap 602B may be hermetically sealed to the base 602B. In some embodiments, the surface 602C of the base 602A to which the MEMS device 601 is secured is larger than the facing surface 601C of the MEMS device 601.

In some embodiments, prior to packaging the MEMS device 601 has a sense capacitor that has a nominal sense capacitance, and a dynamically variable reference capacitor having a nominal reference capacitance. After packaging, or simultaneously with packaging, the capacitance of the sense capacitor and the capacitance of the dynamically variable reference capacitor may change in response to stresses induced by the act of packaging, or the stress from the package itself. In such embodiments, the reference capacitance changes dynamically (i.e., automatically and contemporaneously) to remain substantially matched to the sense capacitance. In other words, the process of packaging the MEMS device 601 includes a step of dynamically adjusting the reference capacitance.

Figure 7:
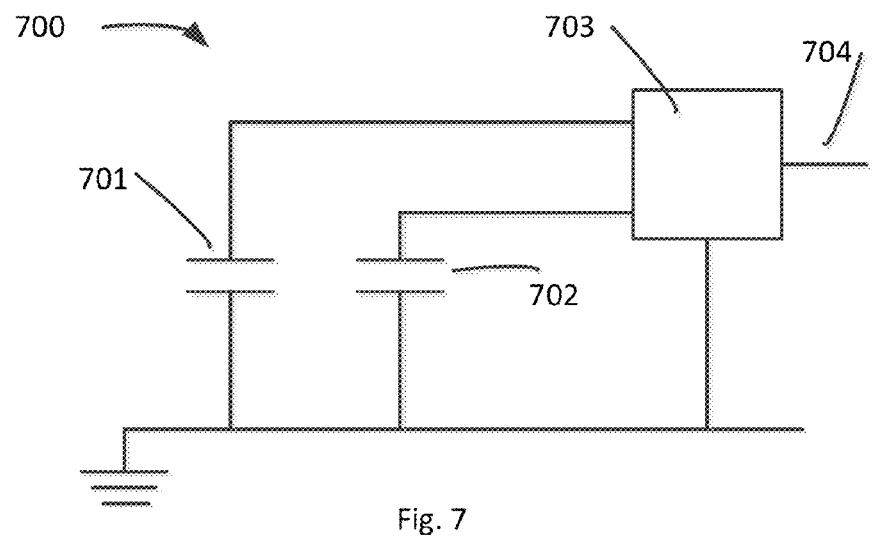
FIG. 7 schematically illustrates a circuit for assessing the change in capacitance between a reference capacitor and a sense capacitor.

A circuit 700 for assessing the change in capacitance of a sense capacitor is schematically illustrated in FIG. 7. A Z-axis sense capacitor 701 (e.g., Czs) and a corresponding Z-axis reference capacitor 702 (e.g., Czr) are electrically coupled to sensing circuit 703. Sensing circuit 703 is configured to determine the difference in capacitance between sense capacitor 701 and corresponding reference capacitor 702. For example, if both sense capacitor 701 and corresponding reference capacitor 702 are charged by clocks as described above, then sensing circuit 703 may couple the capacitors 701 and 702 together in such a way as to allow their charges to offset one another. The magnitude of the remaining charge, if any, is a function of the difference between the capacitors, and the polarity of such a remaining charge indicates whether the capacitance of the sense capacitor 701 has increased or decreased. Sensing circuit 703 may produce an output signal to indicate the results of its assessment on output 704.

Figure 8:
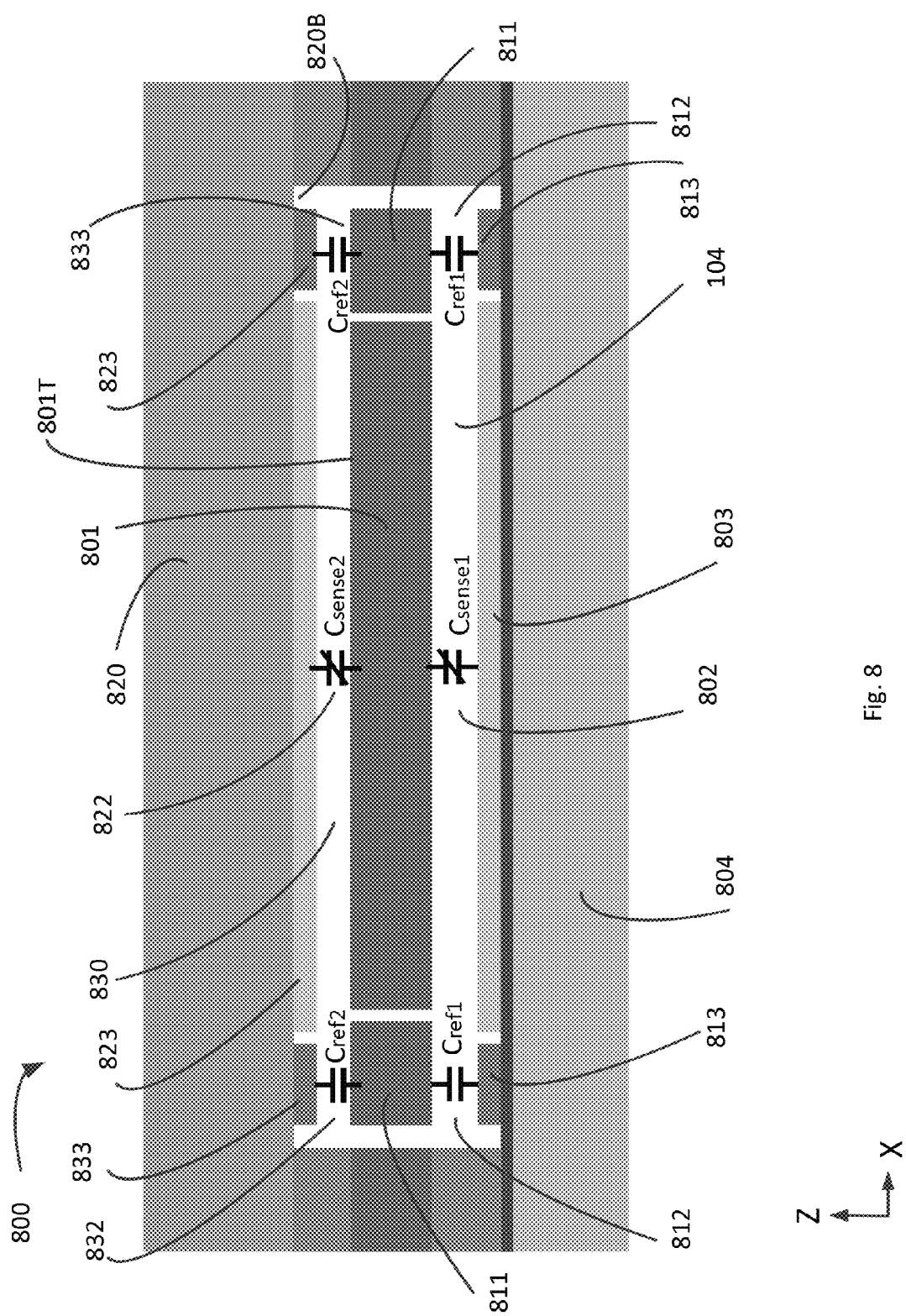
FIG. 8 schematically illustrates another embodiment of an accelerometer.

Yet another embodiment of an accelerometer 800 is schematically illustrated in FIG. 8, and includes a moveable beam 801 that forms a sense capacitance 802 (which may be referred to as "Csense1") with an electrode 803 on or in a substrate 804 across gap 104, as well as at least one cantilevered arm 811 that forms a dynamically variable reference capacitance 812 (which may be referred to as "Cref1") with an electrode 813 on or in the substrate 804. The beam 801 and cantilevered arm 811, and the capacitances 802 and 812 may be similar or identical to the proof mass 102, cantilevered arm 141C and their capacitances as described above.

The accelerometer 800 further includes an additional layer 820 disposed parallel to, and adjacent to, the beam 801, but on a side of the beam 801T opposite the substrate 804. In other words, the beam 801 is disposed between the substrate 804 and the additional layer 820.

The additional layer 820 may be a cap, such as a wafer cap for example, or may be an additional layer of semiconductor device, to name but a few examples. The additional layer 820 is spaced from the beam 801 by a nominal gap 830, although the gap 830 may vary with die stress or packaging stress, as described above in connection with gap 104. Nominally gap 830 is the same as gap 104.

The beam 801 forms a second sense capacitance 822 (which may be referred to as "Csense2") with an electrode 823 on or in the additional layer 820. Specifically, the second sense capacitance 822 is formed, in part, with the same beam 801 that forms a part of the first sense capacitance 802. As the beam 801 moves in the Z-axis, for example in response to an applied acceleration, the capacitance 822 varies in proportion to, but opposite to, capacitance 802. In other words, if the beam 801 moves in such a way that the capacitance 802 increases, then the capacitance 822 decreases proportionately. In another embodiment, the beam 801 is configured in a teeter-totter configuration, as is known in the art of Z-axis accelerometers.

The accelerometer 800 also includes at least one electrode 833, in or on layer 820, that forms a second dynamically variable reference capacitance 832 (which may be referred to as "Cref2") with the at least one cantilevered arm 811. Specifically, the second reference capacitance 832 is formed, in part, with the same cantilevered arm 811 that forms a part of the first reference capacitance 822.

The changes in the two sense capacitances 802 and 822 due to acceleration are processed, for example by a circuit, and the total of the change in the two sense capacitances is given by the equation DeltaCsense=Csense1−Csense2. As such, accelerometer 800 has greater total sense capacitance than an accelerometer having only a single one of the sense capacitances.

Similarly, the two dynamically variable reference capacitances 812 and 832 provide more (e.g., double) reference capacitance than an accelerometer with only a single one of the reference capacitances. The total change in the reference capacitance is given by the equation: DeltaCref=Cref1−Cref2.

As such, the Cref1 dynamically tracks Csense1, and Cref2 dynamically tracks Csense2.

In some embodiments, residue from a fabrication or capping process may produce an electrostatic charge on the substrate (804). For example, an electrostatic charge may be induced by the addition or inclusion of an anti-stiction coating. Such an electrostatic force tends to draw the beam 801 towards the substrate 804, resulting in an offset on the signal output of the accelerometer. However, if a similar fabrication or packaging-induced electrostatic charge appears on the surface 820B of the additional layer 820, then a similar electrostatic force will tend to draw the beam away from the substrate 804. To the first order, the electrostatic force from the top sense plane (820; 820B) will balance the electrostatic force from the bottom sense plane (804). Therefore, in some embodiments, the charge-induced device offset is corrected or mitigated in the embodiment of FIG. 8.

As described in the examples above, various embodiments provide an accelerometer in which an anchor supports a proof mass above a substrate, which proof mass is movable with respect to the substrate in response to acceleration normal to the substrate. The same anchor also supports a cantilevered reference capacitor electrode, which reference capacitor electrode is substantially rigid, and does not move in a direction normal to the substrate under acceleration normal to the substrate. Nevertheless, both the proof mass and reference capacitor may move in response to die stress or warpage, and indeed the proof mass and reference capacitor move such that changes in the sense capacitance and the reference capacitance due to such stress will tend to cancel each other.

DEFINITIONS

As used in this description and the accompanying claims, the following terms shall have the meanings indicated, unless the context otherwise requires. The term "stress" means a force, other than acceleration, that causes a change in the Z-gap between a proof mass and the substrate in a three-axis accelerometer. Stress may include, for example, die stress due to compression, tension or thermal stress. Stress may also include warpage or bowing of a sensor die or package due to external mechanical bending or torsional forces, for example, and may thereby cause deformation of an anchor by which a proof mass is supported.

The term "rigid" in connection with a cantilevered arm of a reference capacitor, which reference capacitor provides a reference capacitance for a corresponding sense capacitance formed by a proof mass, means that if the displacement of the cantilevered arm in the Z-axis due to an acceleration in the Z-axis results in a change in the reference capacitance, that change is small enough so as to be within a tolerance allowed by the accelerometer's specification. For example, in some embodiments a reference capacitance may have a rigid suspension if the change of the magnitude of the reference capacitance is several orders of magnitude smaller than the change of capacitance in a corresponding sense capacitance due to the same acceleration.

Two capacitances are "matched" if the ratio of the two capacitances remains the same, or substantially the same, when both are subjected to stress. Two capacitances are "matched" within a given percentage if the ratio of the two capacitances remains within the given percentage when both are subjected to stress. For example, if a first capacitor has a nominal capacitance of $C1$ and a capacitance of $C1x$ under die stress, and if a second capacitor has a nominal capacitance of $C2$ and a capacitance of $C2x$ under die stress, then the first and second capacitors are matched if $C1/C2=C1x/C2x$. The first and second capacitors are matched to within 0.01 percent if $0.9999\ C1/C2<C1x/C2x<1.0001\ C1/C2$. In various embodiments, a dynamically variable reference capacitance may be matched to a corresponding sense capacitance to within 0.01 percent, or 0.02 percent, or 0.05 percent, to name but a few examples.

A sense capacitor is a capacitor having a capacitance that changes in a predictable way in response to an acceleration. The term sense capacitance may refer to such a capacitor, or to the capacitance of such a capacitor. A sense capacitor has a nominal capacitance when not under acceleration.

A reference capacitor is a capacitor having a capacitance that does not change (or remains substantially unchanged) in response to acceleration in a direction that tends to cause a change of sense capacitance in a corresponding sense capacitor, and which is used as a reference to assess an stimulus-induced (e.g., acceleration-induced) change of capacitance in the corresponding sense capacitor. The term reference capacitance may refer to such a reference capacitor, or to the capacitance of such a capacitor.

A "dynamically variable reference capacitor" is a reference capacitor that dynamically varies, so as to remain contemporaneously matched with a sensing capacitance without operator intervention.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A MEMS device comprising:
   a substrate having a surface, the surface defining a Z-axis normal to the surface;
   an anchor extending from the surface in the direction of the Z-axis;
   a beam suspended from the anchor such that the beam extends over the surface, the beam forming a sense capacitance with the substrate; and
   a dynamically variable reference capacitance comprising a first cantilevered arm suspended from the anchor, the anchor being the same anchor from which the beam is suspended, the first cantilevered arm forming the reference capacitance with the substrate, the reference capacitance providing a reference for the sense capacitance.

2. The MEMS device of claim 1, wherein the dynamically variable reference capacitance is matched to the sense capacitance such that a ratio of the sense capacitance to the reference capacitance remains substantially the same in response to deformation of the substrate.

3. The MEMS device of claim 1, the cantilevered arm further comprising an electrode, the electrode forming the reference capacitance with the substrate.

4. The MEMS device of claim 1, the substrate further comprising a reference electrode, the reference electrode forming the reference capacitance with the cantilevered arm.

5. The MEMS device of claim 1, wherein the beam has an edge length, and the cantilevered arm has a length in a direction extending from the anchor, wherein the length of the cantilevered arm is substantially smaller than the edge length of the beam.

6. The MEMS device of claim 1, wherein the sense capacitance and the dynamically variable reference capacitance are electrically coupled to form a node at the anchor.

7. The MEMS device of claim 1, wherein the anchor defines a cross-section in a plane parallel to the substrate, the cross-section having a first branch and a second branch, the first branch and the second branch meeting at a right angle to form an intersection.

8. The MEMS device of claim 1, the anchor further comprising a chamfered outside corner at the intersection of the first branch and the second branch.

9. The MEMS device of claim 1, wherein the beam has a periphery and the anchor is within the periphery of the beam.

10. The MEMS device of claim 1 wherein the first cantilevered arm comprises a T-shaped electrode.

11. The MEMS device of claim 1 wherein the first cantilevered arm comprises an offset-T electrode.

12. The MEMS device of claim 1, further comprising a second cantilevered arm suspended from the anchor parallel to the substrate and extending from the anchor in a direction orthogonal to the first cantilevered arm.

13. The MEMS device of claim 1, further comprising a sensing circuit electrically coupled to the sense capacitance and the dynamically variable reference capacitance, the sensing circuit configured to assess a difference between a charge on the sense capacitance and a charge on the reference capacitance.

14. A capacitive accelerometer comprising:
a conductive substrate having a first surface, the first surface defining a plane, the plane defining a Z-axis normal to the plane;
a first quadrant structure comprising:
  (a) a chamfered L-shaped anchor having a first branch and a second branch;
  (b) a first cantilevered reference electrode rigidly suspended from the first branch;
  (c) a second cantilevered reference electrode rigidly suspended from the second branch, such that the first cantilevered reference electrode extends from the anchor in a direction orthogonal to the direction of the second cantilevered reference electrode;
a second quadrant structure identical to the first quadrant structure, the second quadrant structure adjacent to the first quadrant structure and rotated in plane by 90 degrees relative to the first quadrant structure;
a third quadrant structure identical to the first quadrant structure, the second quadrant structure adjacent to the second quadrant structure and rotated in plane by 90 degrees relative to the second quadrant structure and by 180 degrees relative to the first quadrant structure;
a fourth quadrant structure identical to the first quadrant structure, the fourth quadrant structure adjacent to the third quadrant structure and rotated in plane by 270 degrees relative to the first quadrant structure, such that the accelerometer has a plurality of anchors, one anchor in each quadrant, and a corresponding plurality of cantilevered reference electrodes; and
a beam suspended from the plurality of chamfered L-shaped anchors, the beam having an outer periphery that surrounds the plurality of chamfered L-shaped anchors and the plurality of cantilevered reference electrodes.

15. The capacitive accelerometer of claim 14, wherein each of the cantilevered reference electrodes comprises a T-shaped electrode.

16. The capacitive accelerometer of claim 14, wherein each of the cantilevered reference electrodes comprises an offset-T-shaped electrode.

17. A method of sensing Z-axis acceleration, the method comprising:
providing a substrate having a surface, the surface defining a Z-axis normal to the surface, and an anchor extending from the surface in the direction of the Z-axis;
providing a sense capacitance comprising a beam suspended from the anchor such that the beam is extends over the surface, the beam forming a sense capacitance with the substrate, the substrate forming one electrode of the sense capacitance; and
providing a dynamically variable reference capacitance, the dynamically variable reference capacitance comprising a cantilevered reference electrode suspended from the anchor, the anchor being the same anchor from which the beam is suspended, the reference capacitance providing a reference for the sense capacitance.

18. The method of claim 17, further comprising dynamically varying the reference capacitance such that a ratio of the sense capacitance to the reference capacitance remains substantially the same in response to deformation of the substrate.

19. The method of claim 17, wherein the sense capacitance has a nominal sense value, and the dynamically variable reference capacitance has a nominal reference value, and the method further comprises packaging the substrate, such that the reference capacitance adapts automatically and contemporaneously to a distortion of the sense capacitance.

20. The method of claim 17, further comprising providing a sensing circuit electrically coupled to the sense capacitance and to the reference capacitance, the sensing circuit configured to assess the difference between a charge on the sense capacitance and a charge on the reference capacitance.

\* \* \* \* \*